United States Patent
Rapp et al.

(10) Patent No.: US 9,762,019 B2
(45) Date of Patent: Sep. 12, 2017

(54) OPERATING A LASER DIODE IN AN OPTICAL NETWORK

(71) Applicant: Xieon Networks S.a.r.l., Luxemburg (LU)

(72) Inventors: Lutz Rapp, Deisenhofen (DE); Guido Gentner, Munich (DE)

(73) Assignee: Xieon Networks S.a.r.l., Senningerberg (LU)

( * ) Notice: Subject to any disclaimer, the term of this patent is extended or adjusted under 35 U.S.C. 154(b) by 53 days.

(21) Appl. No.: 14/787,104

(22) PCT Filed: Apr. 25, 2014

(86) PCT No.: PCT/EP2014/058450
§ 371 (c)(1),
(2) Date: Oct. 26, 2015

(87) PCT Pub. No.: WO2014/174074
PCT Pub. Date: Oct. 30, 2014

(65) Prior Publication Data
US 2016/0087393 A1   Mar. 24, 2016

(30) Foreign Application Priority Data

Apr. 26, 2013  (EP) .................................... 13165472

(51) Int. Cl.
*H04B 17/00* (2015.01)
*H01S 3/094* (2006.01)
(Continued)

(52) U.S. Cl.
CPC .... *H01S 3/094003* (2013.01); *H01S 3/06754* (2013.01); *H01S 3/09408* (2013.01);
(Continued)

(58) Field of Classification Search
CPC ........... H01S 5/06832; H01S 3/094003; H04B 10/07955; H04B 10/503; H04B 10/564; H04B 10/2507
(Continued)

(56) References Cited

U.S. PATENT DOCUMENTS 4,081,670 A   3/1978 Albanese
5,594,748 A   1/1997 Jabr
(Continued)

FOREIGN PATENT DOCUMENTS

WO   2014174074 A1   10/2014

OTHER PUBLICATIONS

Interantional Search Report and Written Opinion, PCT/EP2014/058450, dated Jun. 17, 2014, pp. 1-13.

*Primary Examiner* — Don N Vo
(74) *Attorney, Agent, or Firm* — Nelson Mullins Riley & Scarborough LLP (57) ABSTRACT

A method and a device is provided driving an optical laser diode (710, 711) during operation in an optical communication network, by determining a laser transfer function (741, 742) during operation of the laser diode (710, 711) and providing a control signal (750, 749) for driving the laser diode (710, 711) according to the laser transfer function (741, 742). Further, a method for driving a first and a second optical laser diode during operation in an optical communication network is provided. Furthermore, an optical amplifier and a communication system is suggested.

20 Claims, 9 Drawing Sheets (51) Int. Cl.
*H01S 3/067* (2006.01)
*H01S 3/13* (2006.01)
*H01S 3/30* (2006.01)
*H01S 5/068* (2006.01)
*H01S 5/0683* (2006.01)
*H01S 5/40* (2006.01)
*H04B 10/079* (2013.01)
*H04B 10/50* (2013.01)
*H04B 10/564* (2013.01)
*H01S 5/06* (2006.01)
*H01S 3/10* (2006.01)

(52) U.S. Cl.
CPC .. *H01S 3/094073* (2013.01); *H01S 3/094096* (2013.01); *H01S 3/1305* (2013.01); *H01S 3/302* (2013.01); *H01S 5/06808* (2013.01); *H01S 5/06812* (2013.01); *H01S 5/06832* (2013.01); *H01S 5/4012* (2013.01); *H04B 10/07955* (2013.01); *H04B 10/503* (2013.01); *H04B 10/564* (2013.01); *H01S 3/10069* (2013.01); *H01S 3/1301* (2013.01); *H01S 5/0617* (2013.01)

(58) Field of Classification Search
USPC .......................................................... 398/38
See application file for complete search history.

(56) References Cited

U.S. PATENT DOCUMENTS

| | | | | |
|---|---|---|---|---|
| 7,809,034 | B2 * | 10/2010 | Tanaka | H01S 5/06832 372/29.011 |
| 8,212,703 | B2 * | 7/2012 | Katsis | H03M 1/70 341/118 |
| 2004/0131094 | A1 | 7/2004 | Miremadi | |
| 2005/0220161 | A1 | 10/2005 | Bolshtyansky et al. | |
| 2008/0310268 | A1 * | 12/2008 | Chuang | G11B 7/1267 369/47.52 |
| 2012/0051379 | A1 * | 3/2012 | Wang | H01S 5/0683 372/38.01 |

\* cited by examiner

OPERATING A LASER DIODE IN AN OPTICAL NETWORK

CROSS REFERENCE TO RELATED APPLICATIONS

This application is a 35 U.S.C. 371 national stage filing of International Application No. PCT/EP2014/058450, filed on Apr. 25, 2014, which claims priority to European Patent Applications No. 13165472.5 filed on Apr. 26, 2013. The contents of the aforementioned applications are hereby incorporated by reference in their entireties.

BACKGROUND

The invention relates to a method and to a device for driving optical laser diode(s) in an optical communication network.

In addition, an according optical amplifier and a communication system are suggested.

Optical amplifiers are used in optical communication networks to intensify, e.g., optical signals that are attenuated along the fiber-optic communication path within optical communication networks.

In fiber-optic communication networks, wavelength-division multiplexing (WDM) is a technology which multiplexes a number of optical carrier signals onto a single optical fiber by using different wavelengths (i.e. colors) of laser light. This technique enables bidirectional communications over one strand of fiber, as well as multiplication of capacity.

Raman amplification as one example of optical amplification is based on the Stimulated Raman Scattering (SRS) phenomenon, when a lower frequency signal induces an inelastic scattering of a higher-frequency pump photon in an optical medium in the nonlinear regime. As a result of this, another lower-frequency signal photon is produced and the higher-frequency pump photon is annihilated, with the surplus energy resonantly passed to the vibrational states of the medium. This process, as with other stimulated emission processes, allows all-optical amplification.

Raman amplification is an important technology to increase a maximum distance covered by long-haul optical transmission systems and is a suitable technology to supplement erbium-doped fiber amplifiers (EDFAs) commonly used in commercial installations. According to its large bandwidth, Raman amplification is compatible with the requirements of wavelength-division multiplexing (WDM) networks. One of the main advantages of Raman amplification is the usage of transmission fiber as gain medium, providing distributed amplification.

The trend to higher data rates per wavelength channel requires an improvement of the optical signal-to-noise ratio (OSNR) performance of optical transmission links or spans. In many scenarios, an insertion of additional inline amplifiers is not possible. Hence, Raman amplification is expected to be applied more frequently in future optical networks.

A Raman amplifier is an optical amplifier based on Raman gain, which results from the effect of stimulated Raman scattering. An input signal can be amplified while co-propagating or counter-propagating with a pump beam. A Raman amplifier is preferably, but not necessarily, pumped with continuous-wave light from a diode laser. Signal amplification can be achieved by transferring power from one or more optical pumps to, e.g., a WDM signal. Direct power transfer is possible, but power transfer can also be provided via some additional lightwaves (also called higher-order pumping).

Pumping lightwaves are usually coupled into the transmission fiber at the end of the link, propagating in opposite direction to the signals. This "counter directional pumping" results in an improved optical signal-to-noise ratio (OSNR).

"Co directional pumping" results in a reduction of the nonlinear fiber effects, achieving the same output power level at the output of the transmission fiber with reduced nonlinear interactions as without Raman amplification.

Transients are power variations of signals, induced by adding or dropping of optical channels, which can be caused, e.g., by fiber breaks or component failure and result in significant performance degradation. Such kind of impairments can be mitigated by launching additional lightwaves into the fiber ("filling laser") and by keeping the total power coupled into a span almost constant, even if some of the channels are dropped.

Figure 1:
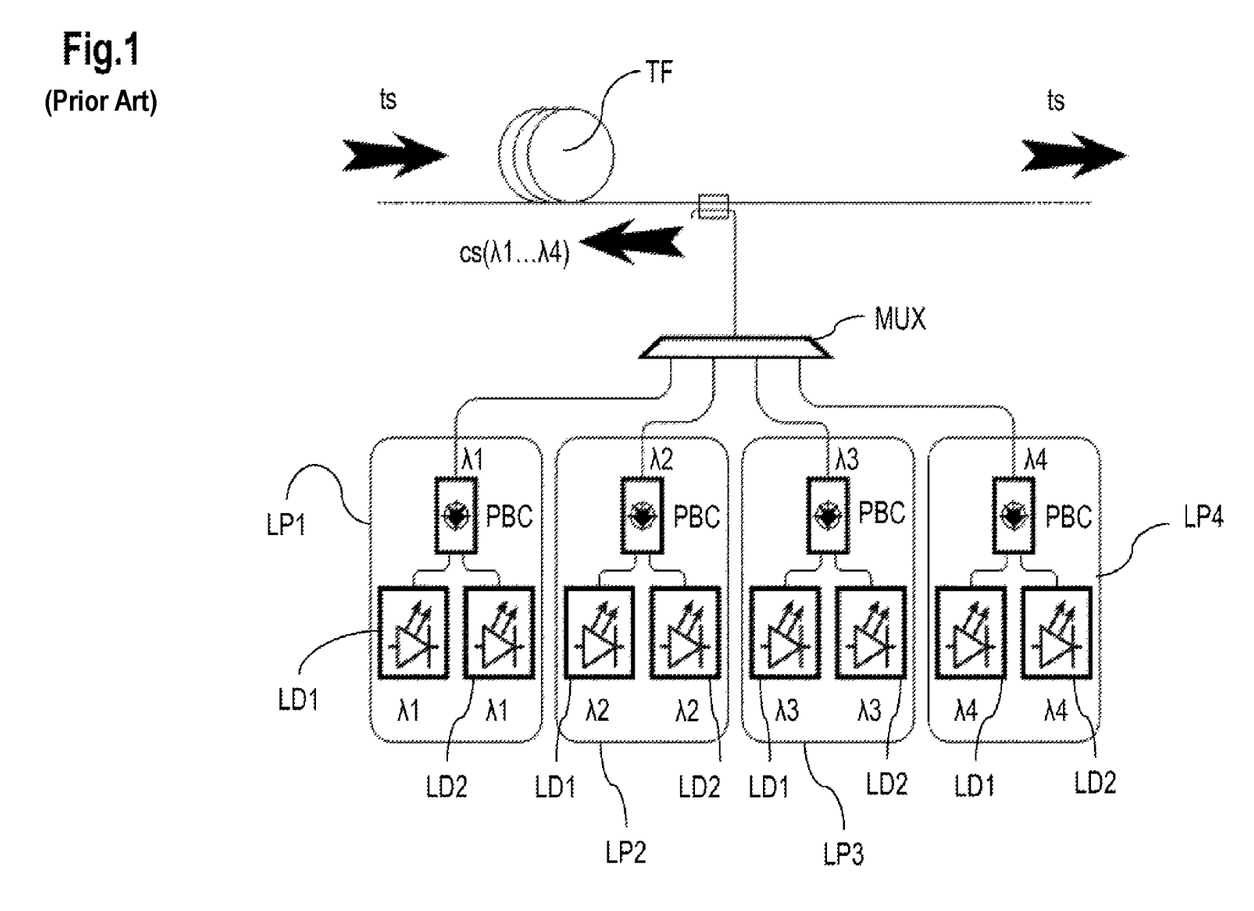
FIG. 1 shows an example of setup of a Raman amplifier.

FIG. 1 shows an exemplary setup of a Raman amplifier, wherein several wavelengths $\lambda 1 \ldots \lambda 4$ of emitted light ("pump wavelength") are used to achieve similar gain for all wavelength signals ("gain flatness"). Each pump wavelength $\lambda 1 \ldots \lambda 4$ is provided by a laser pump LP1 . . . 4 comprising two laser diodes LD1,2, wherein the emitted light at the output of the respective laser diodes LD1,2 is combined by a polarization beam combiner PBC within each of the laser pumps LP1 . . . 4. The provided pump wavelengths $\lambda 1 \ldots \lambda 4$ are combined by a multiplexer MUX, injecting a combined signal $cs(\lambda 1 \ldots \lambda 4)$ into a transmission fiber TF in opposite direction to a transport signal ts.

Laser diodes, which are used in optical communication networks or optical communication systems typically come in a package that includes a pigtail pre-aligned with the laser and a back facet monitor photo diode. For a simple data transmission, the laser diode used to generate a data signal is driven such that laser light intensity is modulated so that each digital level has a distinct optical power. The optical digital level must be kept constant over time and temperature to ensure network integrity.

Figure 2:
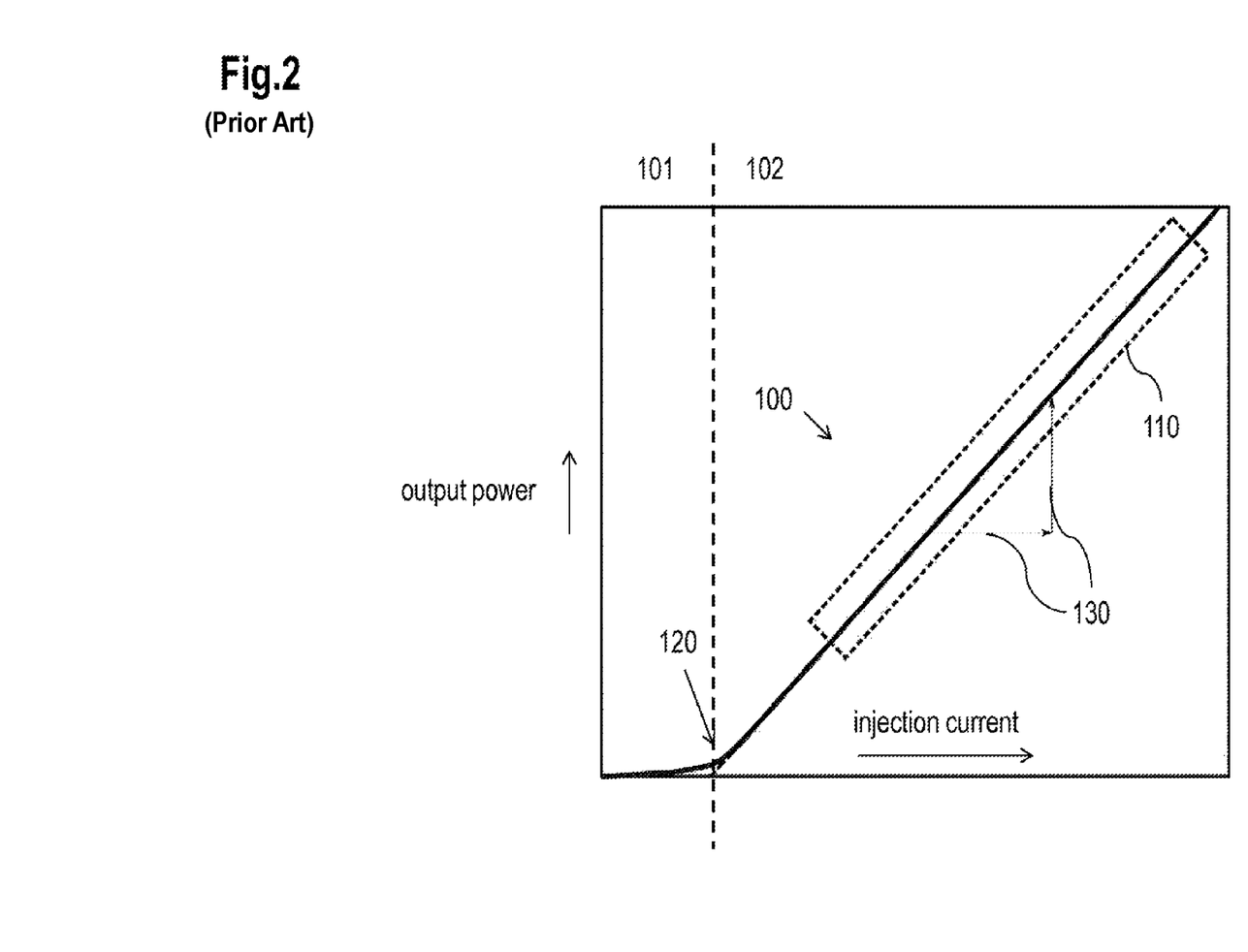
FIG. 2 shows an example of a laser diode transfer curve.

FIG. 2 shows a typical laser diode transfer curve 100, also called "laser transfer function". There are two regions 101, 102 of operation that characterize the laser transfer function 100. A first region 101 is a sub-threshold region, also called "LED region". In this region spontaneous emission of light occurs. A second region 102, above laser threshold is a laser active region, above which stimulated emission of light occurs. In a linear region 110, the intensity of the light ("output power") increases linearly with the injection current through the device. This region 110 of the laser transfer function 110 may also be used for digital transmission of information. A key characteristic of the laser transfer function (also referred to as "L.I. Curve" (Output Light vs. Input Current)) are a threshold current 120 and a slope 130 in the linear region 110 beyond the threshold current 120, referred to as a slope efficiency.

The laser basically is a current-to-light converter and the slope efficiency is a conversion factor. An efficiency of the laser is given by a ratio of optical intensity over injection current or power of emitted light over injection current, and the greater the slope efficiency the more efficient, thus providing higher optical power for a given current through the laser diode.

Unfortunately, the laser transfer function changes over time and temperature. With increasing temperature, the threshold current increases and the slope efficiency falls off exponentially. In addition, aging effects cause the threshold current to increase and the slope efficiency to fall off over the life time of the laser.

A laser diode driver translates logic signals from the electrical domain to the optical domain, delivering current to the laser diode optionally monitoring its output, e.g., with a back facet monitor photo diode.

Optical transponders commercially used are sensitive towards changes of the polarization of the emitted light ("wavelengths") and induced power fluctuation caused by polarization dependent gain (PDG) or polarization dependent loss (PDL). Due to dependencies of the power transfer from the pumps to the transport signal on the respective wavelength-polarization, Raman amplifiers can contribute significantly to PDG or PDL in case of insufficient design or control.

Significant power transfer is mainly possible for copolarized light (lightwaves) whereas the signal gain is almost zero for orthogonally polarized lightwaves.

Due to the polarization dependency, implementation of a single pump lightwave, emitted by a single laser diode is not suitable for signal amplification in WDM systems or networks. Rather a depolarization of the pump is required to achieve polarization independent amplification and performance.

Figure 3A:
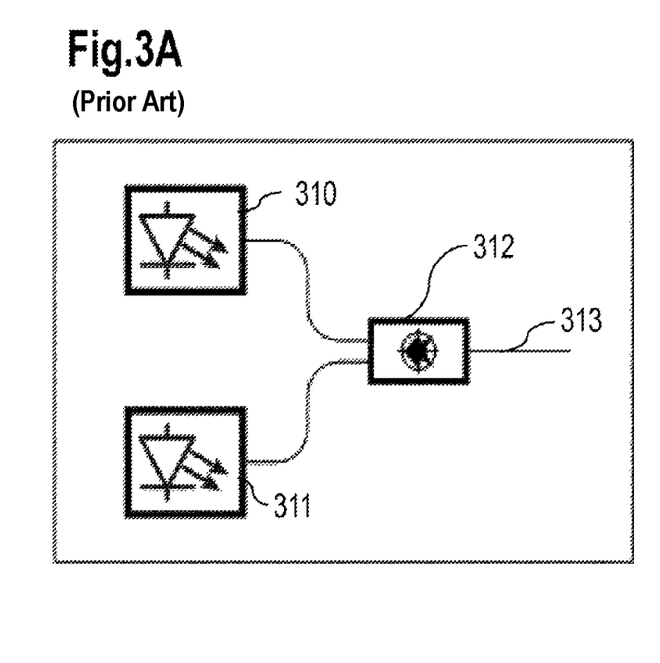
FIGS. 3A and 3B show two schematic diagrams visualizing two different approaches to achieve depolarization of an optical signal provided by a pump.
Figure 3B:
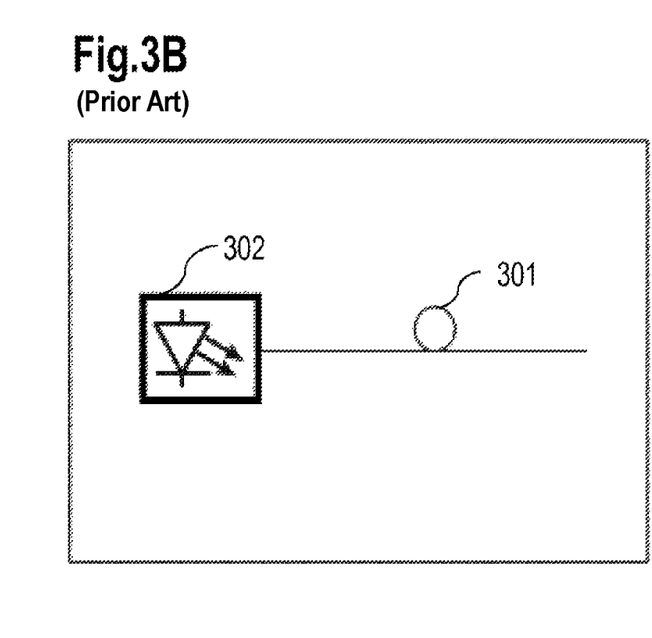

FIGS. 3A and 3B show two schematic diagrams visualizing two different approaches to achieve depolarization of an optical signal provided by a pump, wherein exemplary depolarization of a single wavelength is illustrated. As a further exemplary embodiment (not shown), both setups shown in FIGS. 3A and 3B can be combined into one amplifier. Furthermore, output ports providing signals with different wavelength can be connected to a wavelength combiner (which can be, e.g., an optical multiplexer) as shown in FIG. 1.

The setup according to FIG. 3B is based on a depolarizer 301 implemented, e.g., by a birefrigent optical fiber, which is connected to a laser diode 302. Quite small degrees of polarization ("DoP") can be achieved by an optimized adaptation of the length of the fiber to the line width of the pump lightwave. As this setup is based on a single laser pump/diode 302, respective implementation is only useful if the pump power provided by the single laser diode 302 is sufficient.

However, due to improvements, the power emitted by pump laser diodes in the wavelength range from 1420 nm to 1480 nm has been increased which allows several implementations of this setup in commercial systems.

Still, the power provided by a single laser diode is insufficient for many applications. Hence, a setup according to FIG. 3A is used.

According to this setup, shown in FIG. 3A, lightwaves provided by two laser diodes 310, 311 with identical or almost identical wavelength are combined by a polarization beam combiner 312 coupling the combined signal with orthogonal polarizations to an output fiber 313. Thereby the amount of total pump power concerning a single wavelength at the output of the polarization beam combiner 312 is almost two times the power of a single laser diode.

Since differences in power levels will cause PDG or PDL, the main challenge of this setup is the adjustment of the optical power of the light, emitted by both laser diodes 310, 311 in such a way that the power of emitted light is substantially equal for both orthogonal polarizations.

The same applies to setups to mitigate transient effects.

Figure 4:
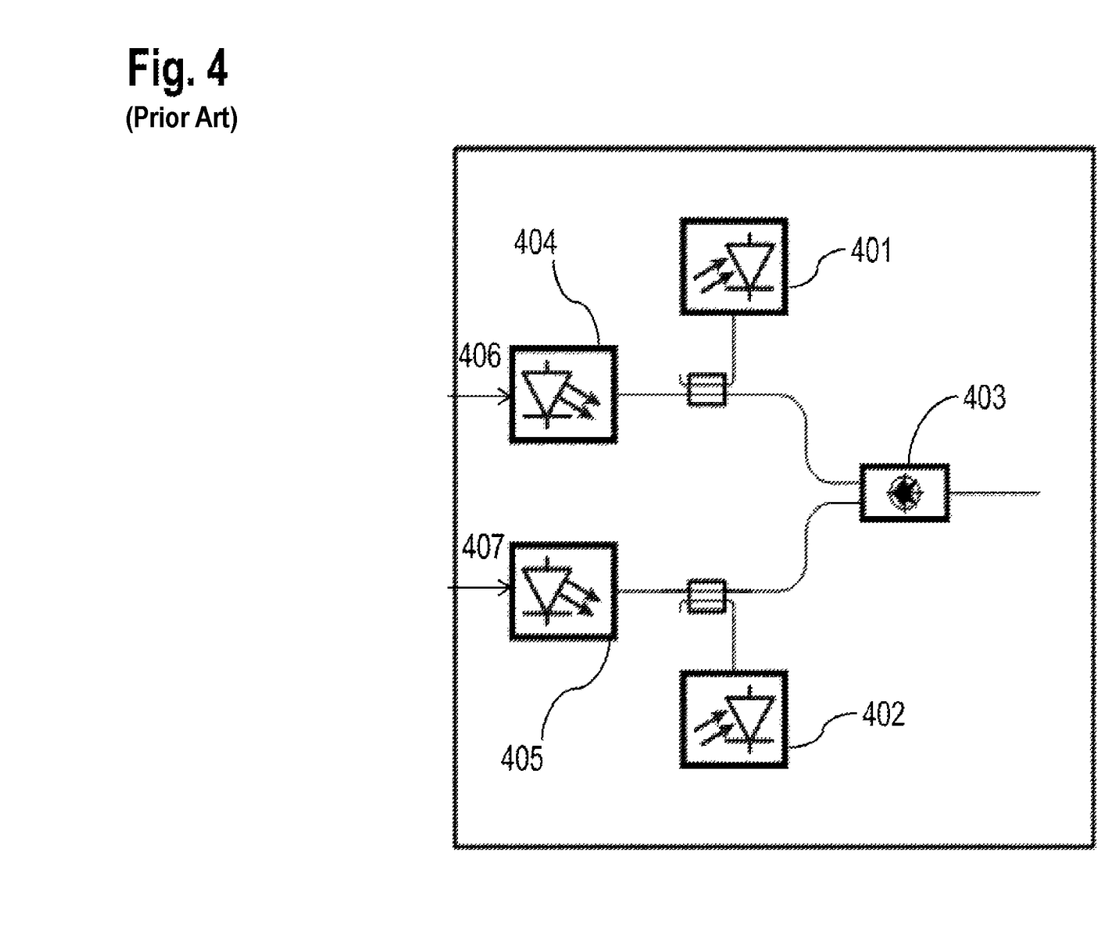
FIG. 4 shows in a block diagram an example for a common approach to eliminate the negative effects of PDG and PDL based on a setup shown in FIG. 3A.

FIG. 4 shows in a block diagram an example for a common approach to eliminate the negative effects of PDG and PDL based on a setup shown in FIG. 3A by implementing monitoring devices 401, 402 in both input branches of the PBC 403 and calibrating the monitors devices 401, 402 at the end of the manufacturing process accordingly. They are calibrated in such a way, that they measure the power of the respective laser diode that is provided at the output of the PBC although they are connected to the input power. With that, the respective level of optical power of each of the optical signals (polarizations) emitted by the respective laser diode 404, 405 can be determined, wherein a driving current 406, 407 for the respective laser diode 404, 405 can be controlled and adjusted accordingly.

Known solutions as mentioned above do have some significant drawbacks:

Two optical monitors are required, one per laser diode, each monitor comprises respectively a photo diode, an optical coupler and an optical splice which involves additional costs;

As the monitors are usually calibrated during the manufacturing process, variations in the transfer function caused, e.g., by component aging or temperature deviations have not been considered. As a consequence, according to an exemplary worst case scenario, the optical power of the light emitted via one of the input branches of the PBC would decrease ("insertion loss") which causes non-identical power levels of the polarizations at the output of the PBC;

Polarization maintaining couplers and splices are required, which causes significant technical complexity in the manufacturing process.

SUMMARY

The objective is thus to overcome such disadvantages and in particular to provide an improved solution for driving optical laser diodes implemented in optical amplifiers.

The present disclosure provides a method for driving an optical laser diode during operation in an optical communication network comprising the following steps:
  determining a laser transfer function during operation of the laser diode;
  providing a control signal for driving the laser diode according to the laser transfer function.

The proposed method implements an optical performance monitoring and recalibration technique during operation which can be based on a laser transfer function of the involved laser diodes, e.g. based on the characteristics of the laser transfer function. The characteristics may be or may be based on an actual "L.I.-Curve" of the laser diodes. Due to ongoing monitoring and recalibration, in particular during operation of an optical system or communication network, an improved performance of optical amplifiers as well as optical communication systems based on such kind of optical amplifiers can be achieved. Beneficially, component aging and temperature deviations can be determined and compensated at least partially or fully.

Operation of a system or a network comprises any kind of information transfer based on analogue or digital transmission/modulation technology including e.g. respective service or maintenance windows of the system or the network.

One further advantage of the proposed solution is the reduction of costs due to a reduced number of monitors (including e.g. photodiodes, optical couplers, optical splices and additional electronics) and due to a reduced number of polarization maintaining couplers, which may not be required for the proposed solution. As a further benefit, better stability over lifetime can be achieved by explicitly considering component aging during system operation.

As a further advantage, complexity of manufacturing can be reduced because only two polarization maintaining splices are necessary for the proposed solution instead of four. Consequently, manufacturing time for optical amplifiers based on the proposed solution can be reduced.

In an embodiment, the laser transfer function is characterized by at least one of
 a threshold current of the laser diode,
 a slope of a linear region beyond the threshold current.

A forward voltage of the laser diode can be determined and the threshold current is derived based on the forward voltage.

The laser diode can be driven by an injection current dependent on the control signal. A modulation is applied to the injection current. At least one parameter of light emitted by the laser diode is determined and the slope of the transfer function is derived based on the modulation and on the at least one parameter.

The present disclosure also provides a method for driving a first and a second laser diode during operation in an optical communication network, comprising the following steps:
 determining a first laser transfer function during operation of the first laser diode;
 determining a second laser transfer function during operation of the second laser diode;
 providing a first control signal for driving the first laser diode according to the first laser transfer function, and
 providing a second control signal for driving the second laser diode according to the second laser transfer function.

The first laser diode can be driven by a first injection current dependent on the first control signal and the second laser diode can be driven by a second injection current dependent on the second control signal.

The first laser transfer function can be characterized by at least one of a threshold current of the first laser diode and a slope of a linear region beyond the threshold current of the first laser diode. The second laser transfer function can be characterized by at least one of a threshold current of the second laser diode and a slope of a linear region beyond the threshold current of the second laser diode.

A forward voltage of the first laser diode can be determined and the threshold current of the first laser diode can be derived based on the forward voltage of the first laser diode. A forward voltage of the second laser diode can be determined and the threshold current of the second laser diode can be derived based on the forward voltage of the second laser diode.

A first modulation can be applied to the first injection current and a second modulation can be applied to the second injection current. At least one parameter related to light emitted by the first laser diode and at least one parameter related to light emitted by the second laser diode can be determined. The slope of the first laser transfer function can be derived based on the first modulation and based on the at least one parameter of light emitted by the first laser diode. The slope of the second laser transfer function can be derived based on the second modulation and based on the at least one parameter of light emitted by the second laser diode.

A modulation with a small amplitude and with a low frequency (also called "small signal low frequency modulation") does not cause any negative effect at the respective receiver located at the other end of an optical link or span. Actual optical receivers, based on coherent detection, apply sophisticated equalization techniques allowing compensation of small signal distortions, in particular in case of slow signal variations. Hence, a small modulation, preferably with sinusoidal waveform, can be applied on the driving current of the laser diodes. The frequency of the modulation is preferably small enough to enable the equalization mechanism of the receiver to compensate the induced signal distortions. By detecting the related modulation in the emitted light received, e.g., by an optical monitor, the slope of the L.I.-Curve of the respective laser diode can be determined.

The first and the second modulation may have a different diode-specific frequency. The first laser transfer function can be determined based on the at least one parameter related to light emitted by the first laser diode and based on the frequency of the first modulation. The second laser transfer function can be determined based on the least one parameter related to light emitted by the second laser diode and based on the frequency of the second modulation.

By using a different frequency for each laser diode with identical wavelength, simultaneous determination of the slope for both laser diodes is feasible, according to one example.

Simultaneous determination of the respective slopes can also be accomplished for all laser diodes operating according to the proposed solution, including laser diodes with different wavelengths, by using different diode-specific frequencies for all laser diodes involved.

In one example, only the first modulation is applied to the first injection current or the second modulation is applied to the second injection current at one instance of time.

The light emitted by the first laser diode and the light emitted by the second laser diode can be combined by a polarization beam combiner.

The first and the second laser diode can be driven such that the at least one parameter related to light emitted by the first laser diode and the at least one parameter related to light emitted by the second laser diode are substantially equal.

The first and the second control signal can be applied such that variations of the first and the second laser transfer function caused by component aging and/or temperature variations are at least partially compensated.

The at least one parameter can be based on the optical power of light.

Based on the continuously updated characteristics of the respective laser diodes the optical power of the light, emitted by each laser diode can be easily adjusted such that the respective level of optical power is substantially equal. This is beneficial for operating optical amplifiers.

The problem stated above is also solved by a device for driving an optical laser diode during operation in an optical communication network, comprising a control unit for determining a laser transfer function during operation of the laser diode in the optical communication network. The control unit is arranged such that a control signal is provided for driving the laser diode according to the laser transfer function.

The present disclosure also provides an optical amplifier comprising
 at least two devices as described above which are used as optical pumps;
 a polarization beam combiner combining light emitted by each of the optical pumps;
 a detector determining at least one parameter of a combined light emitted by the polarization beam combiner, wherein
the control unit of each device is arranged such that the respective laser transfer function is determined based on the at least one parameter of the combined light.

The present disclosure also provides a communication system comprising at least one device as described herein and/or at least one optical amplifier as described herein.

DETAILED DESCRIPTION

Figure 5:
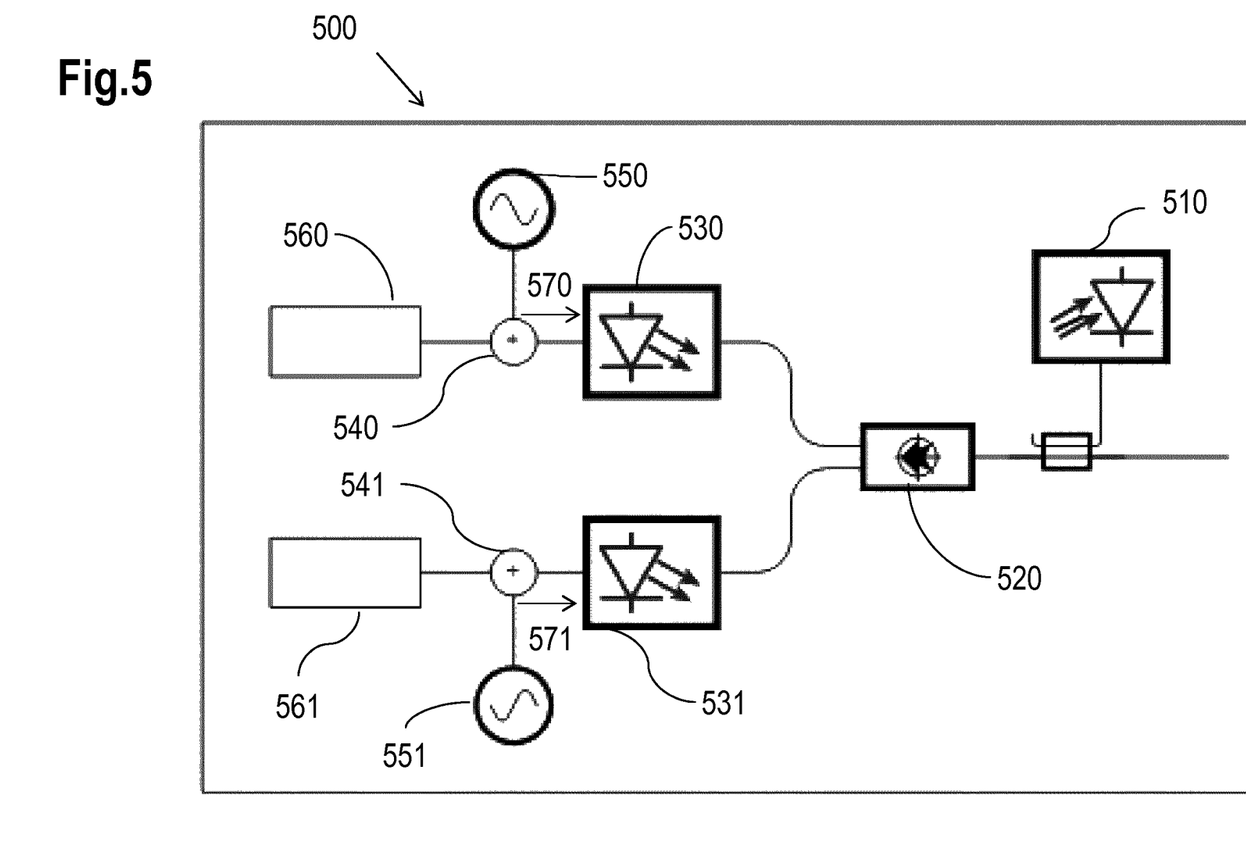
FIG. 5 shows a schematic block diagram of an optical amplifier.

With reference to FIG. 5, in a block diagram, a schematic overview of an optical amplifier 500 according to the proposed solution is shown. The optical amplifier 500 can be arranged as a Raman amplifier. In contrast to prior solutions this setup comprises a single optical monitor 510, e.g., an optical photo diode. The optical monitor is coupled to an output of a polarization beam combiner 520. The amplifier 500 further comprises two optical laser diodes 530, 531 which are separately connected to inputs of the polarization beam combiner 520. The input of the first laser diode 530 is connected to a first electrical adding element 540, which is additionally connected to a first modulator 550 and a first control circuit 560. The input of the second laser diode 531 is coupled to a second electrical adding element 541, which is additionally connected to a second modulator 551 and a second control circuit 561. A first electrical driving current 570 is provided to an input of the first laser diode 530 via the adding element 540 and a second electrical driving current 571 is provided to an input of the second laser diode 531 via the adding element 541.

The setup according to FIG. 5 uses the single optical monitor 510 for determining the total power of light at the given wavelength emitted at the output of the polarization beam combiner 520.

Before starting operation of the amplifier 500, e.g., in an optical communication system or network, a self-calibration step (also called "initial scan") is performed by determining the output power versus driving current for both laser diodes 530, 531. During this scan only one of the laser diodes 530, 531 is active while varying the driving current form zero to a predetermined maximum value. Contemporarily, the voltage (not shown in FIG. 5) applied to the laser diode 530, 531 can also be monitored. Based on that initial calibration, the L.I.-Curve is determined for both laser diodes 530, 531.

Figure 6:
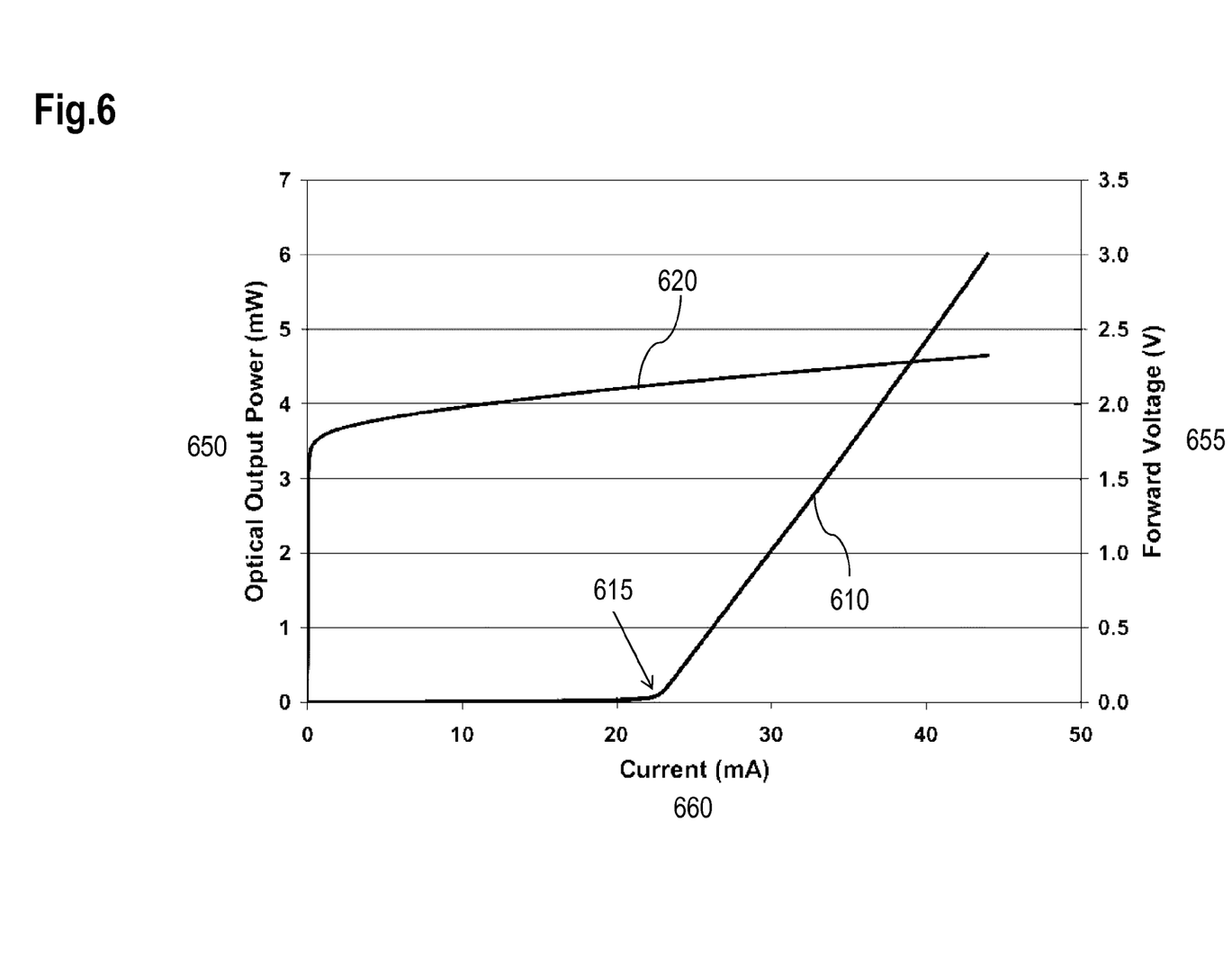
FIG. 6 shows an example of an L.I.-Curve as an exemplary result of an initial calibration of a laser diode; in addition, an example for the relation between the forward current and the injection current are shown.

FIG. 6 shows an example of an L.I.-Curve (laser transfer function) 610 as an exemplary result of the aforementioned initial scan. Up to a certain value of current ("threshold current") 615 no radiation is observed and the optical output power 650 of the laser diode is almost zero. By exceeding the threshold 615, the optical output power 650 increases almost linearly with the drive current 660.

FIG. 6 additionally shows a graph 620 visualizing the increasing course of the forward voltage 655 applied to the laser diodes 530, 531 with increasing driving current 660.

FIG. 7 shows as an exemplary outcome of the initial calibration of an optical amplifier the respective L.I.-Curve determined for a first and second laser diode (pumps), e.g. being part of an optical amplifier as shown in FIG. 5.

Figure 7A:
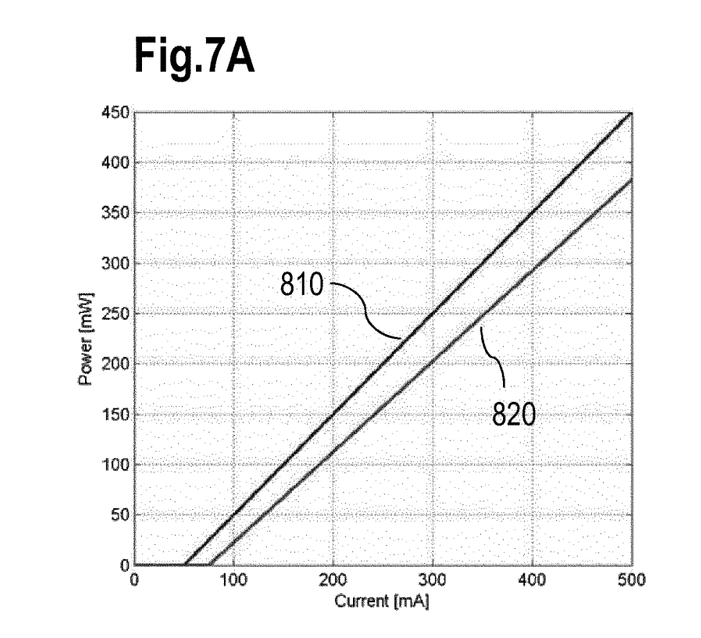
FIG. 7 shows an exemplary result of an initial calibration of an optical amplifier comprising two laser diodes.

FIG. 7A, shows a graph 810 visualizing a relation (L.I.-Curve) between optical output power and a driving current of the first laser diode and a graph 820 visualizing a L.I.-Curve of the second laser diode.

According to FIG. 7A, the threshold current and the slope of the respective L.I. Curve 810, 820 are different for the two laser diodes. Based on the determined L.I.-Curves 810, 820 both laser diodes can be adjusted such that the respective output powers (power of light), emitted by both laser diodes, are substantially equal.

Figure 7B:
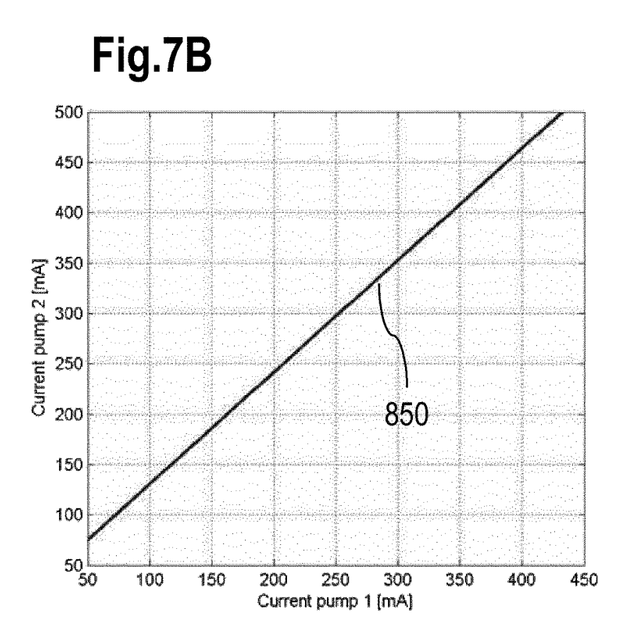

FIG. 7B shows a graph 850 visualizing exemplarily the relation between the respective driving currents ("current pump") for the two pumps calibrated according to FIG. 7A and adjusted such, that the optical output power of the respective emitted light is substantially equal.

As long as the aging effects of the monitor (photodiode, coupler) and other components (except the polarization beam combiner) affects both emitted lights, i.e. both polarizations in the same way, no polarization dependent loss (PDL) and no polarization dependent gain (PDG) is induced.

However, in some scenarios optical systems are running for several years without being turned off. In such kind of situations, aging of the laser diodes, particularly individual aging of the laser diodes may disturb the balance between the two laser diodes (pumps).

In order to maintain the performance of the system over lifetime it is important to detect performance degradation of the laser characteristics during system operation. This can be achieved by the proposed solution.

Figure 8:
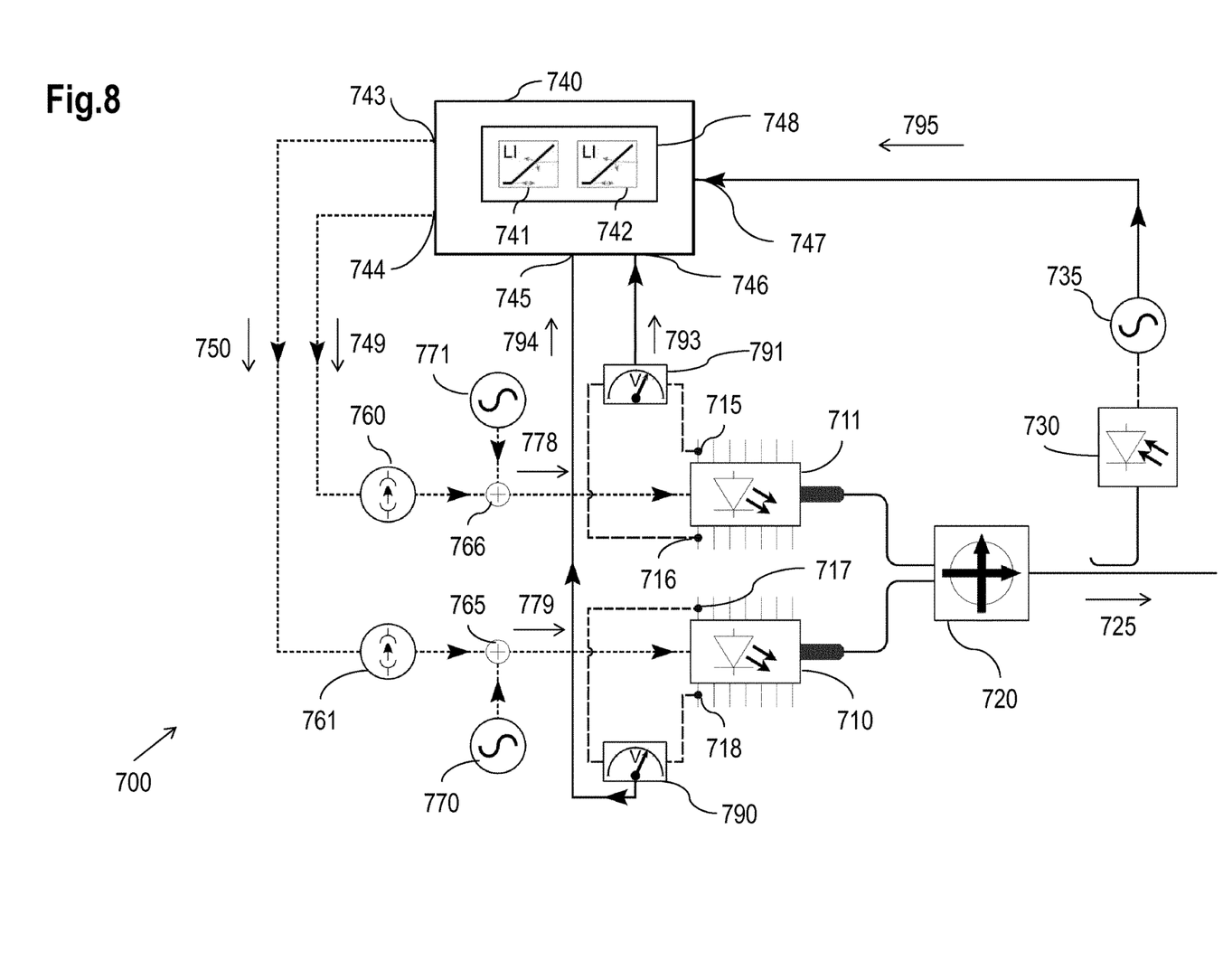
FIG. 8 shows an exemplary control scheme of an optical amplifier.

FIG. 8 shows an exemplary control scheme for an optical amplifier 700. The optical amplifier 700 is arranged as a Raman amplifier which can be part of an optical communication network.

An optical output of a first laser diode 710 is connected to a first input of a polarization beam combiner 720. An optical output of a second laser diode 711 is connected to a second input of the polarization beam combiner 720. An optical signal 725, in particular an optical power of emitted light at the output of the polarization beam combiner 720, is monitored by an optical power monitor 730 which is connected to a detector 735, also referred to as "small signal low frequency detector", which will be explained further below. The detector 735 is connected to an input 747 of a control circuit 740. A first output 743 of the control circuit 740 is coupled to a first current driver 761, which supplies a signal to a first adding element 765, where it is combined with a signal from a first modulator 770, also referred to as "small signal low frequency modulator" (which will be explained below), into a signal 779. A second output 744 of the control circuit 740 is coupled to a second current driver 760, which feeds a signal to a second adding element 766, where it is combined with a signal form a second modulator 771 into a signal 778.

The output of the first adding element 765 drives the first laser diode 710 and the output of the second adding element 766 drives the second laser diode 711.

The signal 779 is also referred to as an injection current or driving current to the first laser diode 710. The signal 778 is also referred to as an injection current or driving current to the second laser diode 711.

A first voltage measurement unit 790 is connected across two measurement pins 717, 718 of the first laser diode 710. A second voltage measurement unit 791 is connected across two measurement pins 715, 716 of the second laser diode 711. An output of the first voltage measurement unit 790 is coupled to an input 745 of the control circuit 740 and an output of the second voltage measurement unit 791 is coupled to an input 746 of the control circuit 740.

The control unit 740 comprises a storage 748 for storing a first L.I.-Curve 741 of the first laser diode 710 and a second L.I.-Curve 742 of the second laser diode 711. According to an exemplarily scenario, both L.I.-Curves 741, 742 were determined and stored in the storage 748 during an initial activation of the Raman amplifier 700, i.e. during self-calibration as explained with regard to FIG. 5 and FIG. 6.

One further aspect of the proposed solution is related to an ongoing recalibration step for updating the stored L.I.-Curves 741, 742, performed continuously during operation of the Raman amplifier 700. Continuous recalibration is beneficial to achieve correct system operation during the lifetime of the laser diodes 710, 711.

Calibration as usually performed during activation of the system (see, e.g., description concerning FIG. 5 and FIG. 6) may otherwise disturb ongoing data traffic during active system operation.

It is thus an advantage of the proposed solution that a relation between an optical power of emitted light and an injection current of a laser diode can be determined also during system operation in particular without any interruption of data traffic. Key parameters, representing the L.I.-Curve, can be derived from physical parameters that can be measured during system operation.

Figure 9:
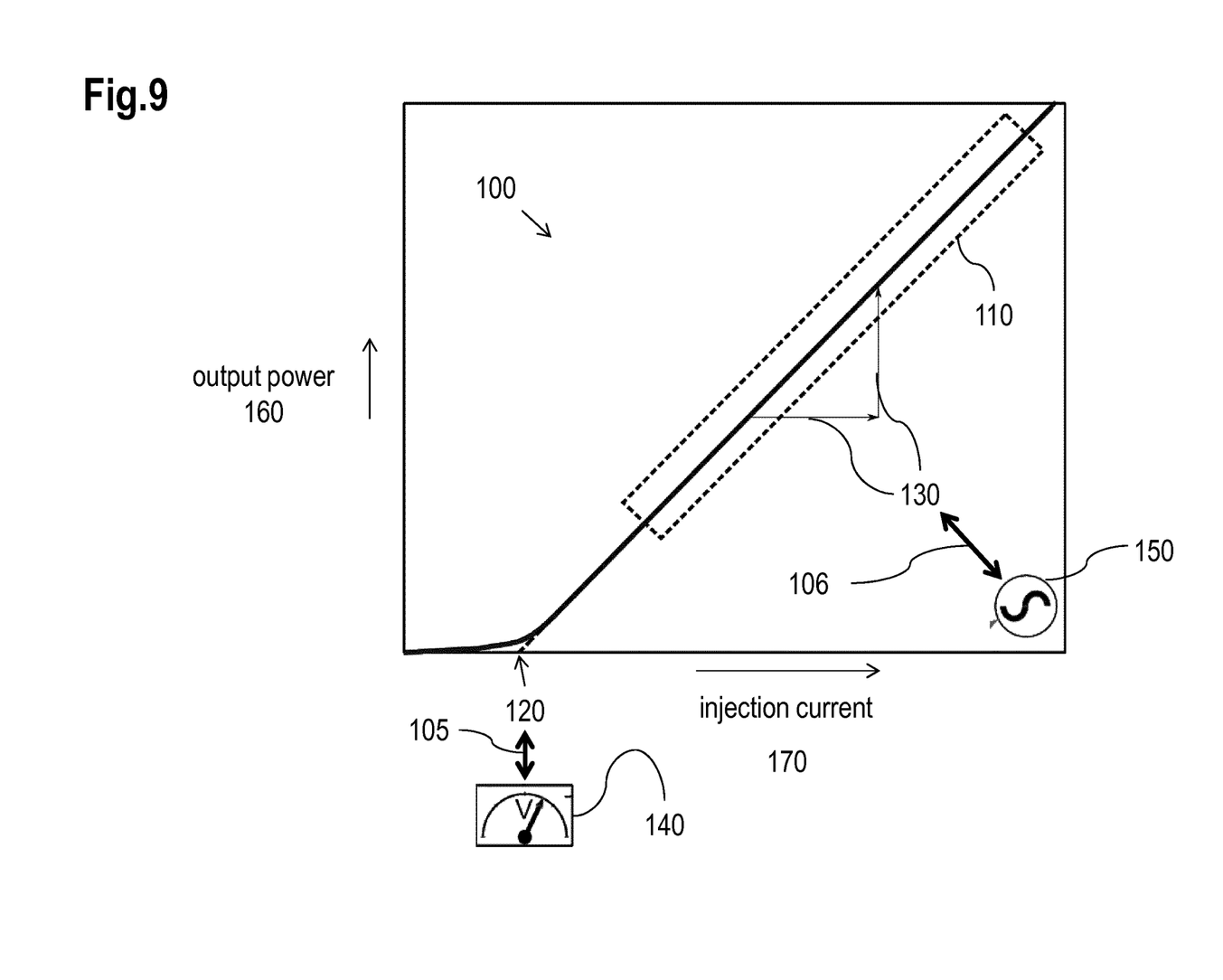
FIG. 9 shows in a diagram the relation between physical parameters, being measurable during system operation, and key parameters characterizing the L.I.-Curve.

FIG. 9 shows a diagram depicting a relation between an output power in view of an injection current, wherein key parameters can be determined, in particular measured, during system operation.

According to FIG. 9, a correlation (also referred to as an L.I.-Curve 100) between an optical output power 160 and an injection current 170 can be derived for an operating range 110, e.g., if a "threshold current" 120 and a "slope of the L.I.-curve" 130 can be determined. Both parameters 120, 130 can be derived from two other physical parameters:

There is an unambiguous relation (indicated by a double arrow 105) between the "threshold current" 120 and a forward voltage 140 (representing the first physical parameter) applied to the respective laser diode, which can be measured during system operation. Determination of this relation, which is, e.g., dependent on the type of each laser diode, can be part of calibration measurements during the manufacturing process of the laser diode. Knowing that relation and based on the actual measurement result of the forward voltage 140, the actual amount of the threshold current 120 of the laser diode can be determined.

The slope of the L.I.-Curve 130 can be determined by applying a modulation with a low amplitude and a low frequency ("small signal low frequency modulation") to the injection current 170 of the laser diode, resulting in a respective modulation of the output power 160, which can be detected in the light emitted by the laser diode. Based on the modulated injection current 170, driving the laser diode and based on the resulting modulated optical output power 160, a modulation index 150 (representing the second physical parameter shown in FIG. 9) of the "small signal low frequency modulation" can be determined. The modulation index 150 is the basis (indicated by an double arrow 106) for determining the slope 130 of the actual L.I.-Curve 100.

With regard to the Raman amplifier 700 shown in FIG. 8, the respective forward voltage applied to the two laser diodes 710, 711 can be determined by the voltage measurement units 790, 791. A signal 794 representing the measured amount of the actual forward voltage applied to the first laser diode 710 is provided to the input 745 of the control circuit 740. Accordingly, a signal 793 representing the measured amount of the actual forward voltage applied to the second laser diode 711 is provided to the input 746 of the control circuit 740.

Based on the forward voltages and based on calibration results derived during the manufacturing process of the laser diodes (which can also be stored in the control unit 740), the actual amounts of the respective threshold currents of the laser diodes 710, 711 can be determined by the control unit 740.

The modulation applied by the respective modulators 770, 771 to each injection current 778, 779 of the laser diodes 710, 711 can be detected by the detector 735, connected to the optical power monitor 730. The optical output power of the signal 725 can thus be determined by the detector 735.

Determining the output power can be performed serially for each involved laser diode 710, 711, i.e. subsequently for one laser diode after the other (in an alternating fashion). Alternatively, this can also be performed for both laser diodes 710, 711 simultaneously by modulating the injection currents 778, 779 with slightly different modulation frequencies, which can be distinguished by the optical power monitor 730 and/or the detector 735.

A signal 795 representing the determined output power of the signal 725 is provided via the detector 735 to the control circuit 740. Thus, on the output of the detector 735 and the modulation applied by the respective modulators 770, 771, the modulation index 150 can be determined by the control unit 740. The modulation index 150 is used to derive the respective slope of the L.I.-Curves of the laser diodes 710, 711.

A further signal may be provided to the control circuit 740 (according to an alternative embodiment, not shown), representing the overall output power of the signal 725, which might be also useful for updating the L.I.-Curves and adjusting the control signals 749, 750, e.g. for performing a consistency check of the determined parameters.

Example for Calculating the L.I. Curve

The laser transfer function (L.I. Curve) can be described by the equation $$P_{LD} = S_{LD}[I_{LD} - I_{LD,th}] \text{ for } I_{LD} \geq 0 \quad (1)$$

with $P_{LD}$ being the output power of the laser diode and $S_{LD}$ denoting the slope of the transfer function at an operating point where a measurement is being performed. The symbol $I_{LD}$ represents the current injected into the laser diode and $I_{LD,th}$ stands for the threshold current. This polynomial of degree one contains two parameters that have to be determined by performing appropriate measurements. From a mathematical point of view, at least two data points are required in order to determine the two independent parameters $S_{LD}$ and $I_{LD,th}$. Measuring the modulation index of the optical power at the modulation frequency provides the required slope $S_{LD}$. For only one laser diode, based on the measured output power of the laser diode at any operating point, the threshold current $I_{LD,th}$ can be determined in an unambiguous way.

With the setup shown in FIG. 8, the situation is different, however. The monitor 730 placed at the output of the polarization beam combiner (PBC) 720 measures the sum of the powers emitted by the two laser diodes 711, 712 after attenuation by the PBC. The power of the two laser diodes can be expressed by two equations:

$$P_{LD}^{(1)} = S_{LD}^{(1)}[I_{LD}^{(1)} - I_{LD,th}^{(1)}] \text{ for } I_{LD}^{(1)} \geq 0 \quad (2)$$

$$P_{LD}^{(2)} = S_{LD}^{(2)}[I_{LD}^{(2)} - I_{LD,th}^{(2)}] \text{ for } I_{LD}^{(2)} \geq 0, \quad (3)$$

where $I_{LD}^{(1)}$, or $I_{LD}^{(1)}$, and $I_{LD}^{(2)}$, or $I_{LD}^{(2)}$, denote the currents at the operating point for the first and the second laser diodes, respectively. The symbols $P_{LD}^{(1)}$, or $P_{LD}^{(1)}$, and $P_{LD}^{(2)}$, or $P_{LD}^{(2)}$, denote the contributions of the two laser diodes to the total power at the monitoring port, i.e. they describe the power emitted by the individual laser diodes and reduced by the attenuation of the PBC. This kind of indexing is applied analogously to the other parameters describing the slopes $S_{LD}$ and the threshold currents $I_{LD,th}$.

Thus, there are four independent parameters that have to be determined, namely $S_{LD}^{(1)}$, $S_{LD}^{(2)}$, $I_{LD,th}^{(1)}$, and $I_{LD,th}^{(2)}$. Using the configuration of FIG. 8, the described technique makes use of two measurement data in order to determine the key parameters for each laser diode, where the slope values $S_{LD}^{(1)}$, $S_{LD}^{(2)}$ are determined from the modulation of the output power, and the threshold currents $I_{LD,th}^{(1)}$, $I_{LD,th}^{(2)}$ are derived from the respective forward voltages measured directly at the laser diodes 711, 712, as explained above. Thus, the values of four parameters can be determined from four measurements, even without using the overall output power value.

The measurement data can be determined with very simple measurement setups. The modulation indices at the two modulation frequencies can be measured by using simple analog circuits to determine the slopes of the transfer function. The threshold currents are derived easily from the measured voltages, see description above. Since these parameters can be determined with negligible effort, an appropriate technique to determine the laser transfer function of both laser diodes during system operation and to provide a low cost solution for control of the laser diodes ca be been presented.

With the actual key parameters ("threshold current" and "slope") for the L.I.-Curves of the respective laser diodes 710, 711, the L.I.-Curves 741, 742, stored in the control unit 740 can be updated.

In this example, the commonly used notation for the L.I.-curve based on the slope and the threshold current has been used. As a matter of course, a large number of equivalent descriptions of the linear part can be used. For example, the linear part can also be described by the equation $$P_{LD} = S_{LD} I_{LD} - P_0 \text{ for } I_{LD} \geq P_0/S_{LD} \quad (4)$$

with the intercept with the y-axis $P_0 = S_{LD} \cdot I_{LD,th}$ outside of the definition range. Additional descriptions based on two data points on the linear curve are also possible. In general, a large number of descriptions for a linear curve are available. However, in all cases the involved parameters can be expressed as a function of the threshold current and the slope of the curve, and thus can be determined by using the present method.

Advantageously, applying a "small signal low frequency modulation" 770, 771 does not cause a negative effect on a receiver side. Optical receivers that are based on coherent detection apply equalization techniques allowing compensation of small signal distortions, in particular in case of slow signal variations. Hence, a small modulation, preferably with sinusoidal waveform, can be applied on the driving current of the laser diodes. The frequency of the modulation is preferably low enough to enable the equalization mechanism on the receiver side to compensate the induced signal distortions.

Since aging causes performance degradation over time, the slope and the threshold degradation can be monitored on a regular or non-regular basis, e.g. once per day or even only once per week. Therefore, it is also an option to apply the monitoring ("degradation monitoring") only during, e.g., service or maintenance of the optical system/network or during operation which is unsusceptible for small distortions. An information about times suitable for monitoring can be, e.g., communicated by the management system based on a preFEC bit error rate (BER) of the transponders, which is a bit error rate determined before correction of potential transmission errors by a forward error correction (FEC).

As an example, degradation of InGaAsP (InGaAs)/InP laser diodes typically causes a decrease of the diode-specific forward voltage at a given driving current. Hence, according to the proposed solution, an increase of the diode-specific threshold current can be derived from the measured decrease of the forward voltage, given that the aforementioned correlation between these two parameters is known dependent on the type of the laser diode.

As detailed in the following, the accuracy of the technique can be further improved. Four measurement data are used to determine the four key parameters governing the two involved L.I.-curves (slope of the linear part of the curve for both laser diodes and the respective threshold currents). In the present example, two modulation signals and the two forward voltages of the laser diodes have been used for this purpose. However, the present setup provides a fifth parameter, namely the power $P_{tot}$ of the optical signal 725 composed of the contributions from both laser diodes. This value can be used to check the accuracy of modeling of the laser characteristics and also allows to perform some corrections.

Thanks to the calibration of the monitor, the contributions from the two laser diodes can be derived from the L.I.-curves. In the ideal case, the sum $$P_{LD}^{(1)} + P_{LD}^{(2)} = S_{LD}^{(1)}[I_{LD}^{(1)} - I_{LD,th}^{(1)}] + S_{LD}^{(2)}[I_{LD}^{(2)} - I_{LD,th}^{(2)}] \quad (5)$$

corresponds to the total power $P_{tot}$, for $I_{LD}^{(1)} \geq 0$ and $I_{LD}^{(2)} \geq 0$. The difference between the sum calculated according to the above equations and the measured power $P_{tot}$ is a measure for the accuracy of the modeling. Higher accuracy comes along with smaller deviations.

Serving as an example, it will be explained in the following how the measured power level $P_{tot}$ can be used to improve the accuracy of the model. Most likely, deviations are resulting from the assumed correlation between the threshold current and the forward voltage. Typically, both laser diodes are based on the same technology and it may be assumed that both estimated values of the threshold currents are affected by the same relative deviation from the actual value. This is taken into account by introducing a correction factor $\alpha_{CORR}$ in the description of the L.I.-curves:

$$P_{LD}^{(1)} = S_{LD}^{(1)}[I_{LD}^{(1)} - \alpha_{CORR}I_{LD,th}^{(1)}] \text{ for } I_{LD}^{(1)} \geq 0 \quad (6)$$

$$P_{LD}^{(2)} = S_{LD}^{(2)}[I_{LD}^{(2)} - \alpha_{CORR}I_{LD,th}^{(2)}] \text{ for } I_{LD}^{(2)} \geq 0, \quad (7)$$

Since the sum $P_{LD}^{(1)} + P_{LD}^{(2)}$ to be equal to the measured power $P_{tot}$, this correction factor can be determined by using the equation $$\alpha_{corr} = \frac{S_{LD}^{(1)} I_{LD}^{(1)} + S_{LD}^{(2)} I_{LD}^{(2)} - P_{tot}}{I_{LD,th}^{(1)} + I_{LD,th}^{(2)}} \quad (8)$$

The terms $I_{LD}^{(1),new} = \alpha_{CORR} I_{LD,th}^{(1)}$ and $I_{LD,th}^{(2),new} = \alpha_{CORR} I_{LD,th}^{(2)}$ can be referred to as new threshold currents.

In the example described above, the key parameters describing the two involved L.I.-curves are determined based on four measurement data, namely the modulation signal and the voltage for each laser diode. However, the described setup also provides a fifth parameter (output power). Thus, there are measurement data for five physical parameters available. Any selection of four values out of these five values is sufficient to determine the four key parameters required to accurately describe the involved L.I.-curves. However, each selection contains at least one measurement value for a voltage.

An advantage of the proposed solution is a continuous or iterative determination of key parameters used for updating the L.I.-Curves during operation of an optical system or optical communication network. Preferably, updated L.I. Curves 741, 742 of the laser diodes 710, 711 are made available at all times, which allows "on-time" feed forward control of the laser diodes 710, 711. An appropriate control signal 750 is provided by the control unit 740 to the first current driver 761. Accordingly, the control signal 749 is provided by the control unit 740 to the second current driver 760. Dependent on the control signals 750, 749 the first and second current drivers 761, 760 can be adjusted.

Based on the updated characteristics of the respective laser diodes ("optical pumps"), the control signals 750, 749 can be generated such that the output power of the light emitted by each laser diode 710, 711 is substantially equal. This is advantageous for a proper operation of optical amplifiers, in particular Raman amplifiers.

High power optical pumps used for Raman applications may comprise a thermoelectric cooler (TEC) using the "Peltier effect" for stabilizing a chip temperature at a predefined value. In the future, pumps without TEC may be implemented in Raman applications, which makes monitoring the impact of varying temperatures on optical pumps a beneficial feature of the current solution.

Higher temperatures cause an increased value of the threshold current and a reduced value of the slope of the respective L.I.-Curve.

Furthermore, the forward voltage decreases with an increasing temperature at a constant driving current.

The aforementioned impact of varying, in particular increasing temperature on the characteristics of the L.I-Curve is similar to the effect of a decreasing reliability and degradation of the laser diode caused by component aging.

Consequently, the proposed solution can also be applied for driving laser diodes operated at different temperatures.

Effects based on a significant amount of aging and/or high temperature may result in a modified shape of the L.I.-Curve, e.g., a curvature instead of a straight line. Normally, such kind of operating conditions are not suitable for Raman amplification. As a further advantage of the proposed solution, it is feasible to model the modified shape of the L.I.-Curve. Such model of the L.I.-Curve may be used as a basis for driving the laser diode under varying conditions to achieve a proper and suitable operation of the Raman amplification.

LIST OF ABBREVIATIONS

BER bit error rate
DoP degree of polarization
FEC forward error correction
OSNR optical signal-to-noise ratio
PBC polarization beam combiner
PDG Polarization Dependent Gain
PDL Polarization Dependent Loss
WDM Wavelength Division Multiplexing

The invention claimed is:

1. A method for driving at least one optical laser diode during operation in an optical communication network, comprising:
   determining a laser transfer function during operation of the at least one laser diode;
   determining a forward voltage of the at least one laser diode; and
   providing a control signal for driving the at least one laser diode according to the laser transfer function;
   wherein at least one parameter governing the laser transfer function is derived from the forward voltage.

2. The method according to claim 1, wherein
   the laser transfer function of the at least one laser diode is characterized by a threshold current and a slope of a linear region beyond the threshold current; and
   the threshold current is derived based on the forward voltage.

3. The method according to claim 1, wherein
   the at least one laser diode is driven by an injection current dependent on the control signal;
   a modulation is applied to the injection current;
   a parameter related to light emitted by the at least one laser diode is determined; and
   the slope of the transfer function is derived based on the modulation and on said parameter.

4. The method of claim 1 further comprising:
   determining a first laser transfer function during operation of the first laser diode;
   determining a second laser transfer function during operation of the second laser diode;
   providing a first control signal for driving the first laser diode according to the first laser transfer function, and
   providing a second control signal for driving the second laser diode according to the second laser transfer function.

5. The method according to claim 4, wherein
   the first laser diode is driven by a first injection current dependent on the first control signal;
   the second laser diode is driven by a second injection current dependent on the second control signal.

6. The method according to claim 5, wherein
   a first modulation is applied to the first injection current;
   a second modulation is applied to the second injection current;
   a parameter related to light emitted by the first laser diode and a parameter related to light emitted by the second laser diode is determined;

the slope of the first laser transfer function is derived based on the first modulation and based on the parameter related to light emitted by the first laser diode;

the slope of the second laser transfer function is derived based on the second modulation and based on the parameter related to light emitted by the second laser diode.

7. The method according to claim 6, wherein the first and the second modulation have a different frequency;

the first laser transfer function is determined based on the parameter related to light emitted by the first laser diode and based on the frequency of the first modulation;

the second laser transfer function is determined based on the parameter related to light emitted by the second laser diode and based on the frequency of the second modulation.

8. The method according to claim 6, wherein the first modulation is applied to the first injection current at the same time or at a different time different from when the second modulation is applied to the second injection current.

9. The method according to claim 6, wherein the first and the second laser diode are driven such that the parameter related to light emitted by the first laser diode and the parameter related to light emitted by the second laser diode are substantially equal.

10. The method according to claim 4, wherein the first and the second control signal are applied such that variations of the first and the second laser transfer function caused by at least one of component aging and temperature variations are at least partially compensated.

11. The method according to claim 4, wherein the light emitted by the first laser diode and the light emitted by the second laser diode are combined by a polarization beam combiner.

12. The method according to claim 11, wherein at least one of the parameter related to light emitted by the first laser diode and the parameter related to light emitted by the second laser diode are determined from the power of an optical signal at or after an output port of the polarization beam combiner.

13. The method of claim 11 wherein an output power resulting from the combined emission of both laser diodes measured at or after an output port of the polarization beam combiner is used for performing a consistency check or calibration operation on the parameters determined.

14. The method according to claim 1, wherein the at least one parameter is based on an optical power of light.

15. A device for driving an optical laser diode during operation in an optical communication network, comprising:

a voltage measurement unit for measuring a forward voltage of the laser diode; and a control unit for determining a laser transfer function during operation of the laser diode in the optical communication network;

wherein the control unit is arranged such that a control signal is provided for driving the laser diode according to the laser transfer function; wherein the control unit derives at least one parameter governing the laser transfer function from the forward voltage.

16. The device according to claim 15, wherein the laser transfer function is characterized by a threshold current of the laser diode and a slope of a linear region beyond the threshold current; and wherein the control unit determines the threshold current based on the forward voltage.

17. An optical amplifier comprising at least two devices according to claim 15 which are used as optical pumps of the optical amplifier;

a polarization beam combiner combining light emitted by each of the optical pumps; and a detector determining a parameter of a combined light emitted by the polarization beam combiner, wherein the control unit of each device is arranged such that the respective laser transfer function is determined based on the parameter of the combined light.

18. The optical amplifier of claim 17 wherein the control units of the respective devices are implemented in a common control circuit.

19. Communication system comprising at least one device according to claim 15 and at least one optical amplifier according to claim 17.

20. Communication system comprising at least one of:

at least one device for driving an optical laser diode during operation in an optical communication network, comprising:

a voltage measurement unit for measuring a forward voltage of the laser diode; and a control unit for determining a laser transfer function during operation of the laser diode in the optical communication network;

wherein the control unit is arranged such that a control signal is provided for driving the laser diode according to the laser transfer function; wherein the control unit derives at least one parameter governing the laser transfer function from the forward voltage; and at least one optical amplifier comprising at least two devices according to claim 15 which are used as optical pumps of the optical amplifier;

a polarization beam combiner combining light emitted by each of the optical pumps; and a detector determining a parameter of a combined light emitted by the polarization beam combiner, wherein the control unit of each device is arranged such that the respective laser transfer function is determined based on the parameter of the combined light.

* * * * *